United States Patent
Alt et al.

(10) Patent No.: US 11,607,681 B2
(45) Date of Patent: Mar. 21, 2023

(54) LIQUID HANDLING DEVICE AND A METHOD FOR ENERGIZING A LIQUID HANDLING DEVICE

(71) Applicant: Sartorius Biohit Liquid Handling Oy, Helsinki (FI)

(72) Inventors: Sami Alt, Helsinki (FI); Janne Leinonen, Kuluntalahti (FI)

(73) Assignee: Sartorius Biohit Liquid Handling Oy, Helsinki (FI)

( * ) Notice: Subject to any disclaimer, the term of this patent is extended or adjusted under 35 U.S.C. 154(b) by 950 days.

(21) Appl. No.: 16/441,061

(22) Filed: Jun. 14, 2019

(65) Prior Publication Data

US 2019/0381496 A1 Dec. 19, 2019

(30) Foreign Application Priority Data

Jun. 15, 2018 (EP) .................................... 18178033

(51) Int. Cl.
| | | |
|---|---|---|
| *B01L 3/02* | (2006.01) | |
| *H02J 7/34* | (2006.01) | |
| *H01L 31/02* | (2006.01) | |
| *H01L 35/02* | (2006.01) | |
| *H01L 41/04* | (2006.01) | |

(52) U.S. Cl.
CPC ........... *B01L 3/0237* (2013.01); *B01L 3/0241* (2013.01); *H02J 7/34* (2013.01); *B01L 2300/024* (2013.01); *B01L 2300/027* (2013.01); *B01L 2300/0645* (2013.01); *H01L 31/02* (2013.01); *H01L 35/02* (2013.01); *H01L 41/04* (2013.01); *H02J 7/345* (2013.01)

(58) Field of Classification Search
CPC ...... B01L 3/0237; B01L 3/0241; B01L 3/021; B01L 3/0275; B01L 2300/024; B01L 2300/027; B01L 2300/0645; B01L 2300/02; B01L 2300/0832; H02J 7/34; H02J 7/345; H01L 31/02; H01L 35/02; H01L 41/04
See application file for complete search history.

(56) References Cited

U.S. PATENT DOCUMENTS

| | | |
|---|---|---|
| 2002/0076353 A1 | 6/2002 | Lehmann |
| 2002/0134176 A1 | 9/2002 | Bigus |
| 2004/0057875 A1* | 3/2004 | Bigus ................... B01L 3/0227 436/163 |
| 2007/0135756 A1* | 6/2007 | Kohlbrenner ..... A61M 5/31553 604/21 |
| 2007/0182362 A1 | 8/2007 | Trainor et al. |
| 2009/0000350 A1 | 1/2009 | Magnussen et al. |
| 2009/0000403 A1* | 1/2009 | Magnussen ........... B01L 3/0237 73/864.18 |

(Continued)

FOREIGN PATENT DOCUMENTS

| | | |
|---|---|---|
| CN | 205610941 U | 9/2016 |
| JP | 2007160095 A | 6/2007 |

(Continued)

*Primary Examiner* — Christopher Adam Hixson
(74) *Attorney, Agent, or Firm* — Laine IP Oy

(57) ABSTRACT

According to an example aspect of the present invention, there is provided a liquid handling device comprising: means for harvesting energy; energy storage arranged for storing the harvested energy in the liquid handling device; and an electronic component connected to the energy storage and configured to use the energy storage as a power source.

17 Claims, 4 Drawing Sheets

(56) References Cited

U.S. PATENT DOCUMENTS

| | | | |
|---|---|---|---|
| 2012/0068669 A1 | 3/2012 | Trainor et al. | |
| 2012/0081874 A1* | 4/2012 | Wu | G02F 1/1333 361/679.01 |
| 2012/0291567 A1 | 11/2012 | Homberg et al. | |
| 2016/0089601 A1* | 3/2016 | Terry | A63F 13/285 463/37 |
| 2017/0335271 A1 | 11/2017 | Maggiore | |
| 2018/0056286 A1 | 3/2018 | Zucchelli | |
| 2018/0068632 A1 | 3/2018 | Wu et al. | |

FOREIGN PATENT DOCUMENTS

| | | |
|---|---|---|
| JP | 2013543984 A | 12/2013 |
| WO | WO 2014138530 A2 | 9/2014 |

* cited by examiner

LIQUID HANDLING DEVICE AND A METHOD FOR ENERGIZING A LIQUID HANDLING DEVICE

FIELD

The present invention relates generally to liquid handling devices, and more particularly to self-charging power systems for liquid handling devices.

BACKGROUND

Traditionally, hand-held pipettes have been categorized to mechanical and electric pipettes. A third category consists of so-called electromechanical or hybrid pipettes. In electromechanical pipettes, part of functionalities is implemented by means of mechanical machinery, while another part is implemented by using electronic components.

In electromechanical pipettes, a mechanical volume display or counter has typically been replaced by an electronic LCD display. A segmented LCD display requires a low power, and therefore a button cell or a rechargeable battery can be used as a power source. However, such power sources require either frequent changing or regular recharging, which necessitates disassembling of the pipette, or a charging socket or a charging dock. Further, such power sources are self-discharging, implying that a new power source must always be charged before the first use.

A disadvantage of the known electromechanical or electronic pipettes is that in the event of battery discharge, the electronic components stop functioning completely. For example, an electronic display shuts off, which may lead to loss of information.

Reduction of the power consumption of electric and electromechanical pipettes has been strived after by various means, for example by limiting the number of electronic components and by using low-power components.

Electronic paper displays, which are also called e-paper displays or E ink displays, have attracted a lot of interest in recent years and they have been applied to many consumer products. Electronic paper displays mimic the appearance of ordinary ink on paper. E-paper displays reflect light, whereas conventional flat panel displays are backlit and thus emit light. The advantages of e-paper displays include their ability to display static text and images without any supply of power, and their flexibility: the substrate and the electronics of the backplane are made of plastic materials. In an e-paper display, the contrast is good and the viewing angle wide (170 degrees). An E ink display can be a black-and-white display or a colour display.

Various technologies are being used for implementing e-paper technology: electrophoretic displays, electrowetting displays, electrofluidic displays, and plasmonic electronic displays. The electronic ink technology that has been commercialized by E Ink Corporation is based on small transparent microcapsules. Each microcapsule represents a pixel and contains a positively charged white pigment particle and a negatively charged black pigment particle. When a positive or negative electric field is applied, the charged pigment particles become rearranged within each capsule to change the color of the surface to either white or black. Even three-color versions have been developed.

It is known to employ e-paper displays in place of LCD displays for example in automated analyzers.

WO 2014138530 A2 describes an automated clinical chemistry analyser comprising electronically rewriteable surfaces (e.g. E ink displays) configured to dynamically display optical marks, and independently movable carriers configured to move along the surfaces and to observe the marks to determine navigational information from the optical marks.

There exists a need for a mechanical pipette comprising electronic functionalities.

There exists a need for an electronic pipette with an extended battery life.

There exists a need for an electromechanical pipette that provides a similar user experience as purely mechanical pipettes.

The embodiments of the present invention are intended to overcome at least some of the above discussed disadvantages and restrictions of the known electromechanical pipettes.

SUMMARY OF THE INVENTION

The invention is defined by the features of the independent claims. Some specific embodiments are defined in the dependent claims.

According to a first aspect of the present invention, there is provided a liquid handling device comprising: means for harvesting energy; energy storage arranged for storing the harvested energy in the liquid handling device; and an electronic component connected to the energy storage and configured to use the energy storage as a power source.

Various embodiments of the first aspect may comprise at least one feature from the following bulleted list:

- The electronic component is connected to the energy storage and configured to be energized by the stored and harvested energy.
- The means for harvesting energy is connected to the energy storage.
- The energy storage is connected to the electronic component.
- The means for harvesting energy is a magnet-through-coil system connected to a button of the liquid handling device and configured to harvest energy when the button is pushed or released.
- The means for harvesting energy comprises a thermoelectric generator.
- The liquid handling device is a hand-held pipette.
- The means for harvesting energy comprises piezoelectric material.
- Said piezoelectric material is incorporated in a material of a part of the liquid handling device, for example a button or a body or a handle of the liquid handling device.
- The liquid handling device is a hand-held pipette, and the means for harvesting energy comprises a solar cell integrated to the pipette.
- The liquid handling device is a hand-held electronic pipette, and the solar cell is a UV sensitive solar cell.
- The electronic component is a display, preferably an electronic paper display.
- The liquid handling device is a hand-held pipette, and the electronic component is an electronic paper display integrated to a body of the pipette and having a shape with substantially the same curvature as the body of the pipette.
- The electronic component is a sensor configured to measure a state of the liquid handling device.
- The sensor is an optical sensor configured to monitor a tip of the liquid handling device or the contents of the tip.
- The electronic component is an RFID tag attached to the liquid handling device.

The electronic component is a usage counter that records the usage of the liquid handling device.

The energy storage is a lithium ion battery or a supercapacitor.

According to a second aspect of the present invention, there is provided a method for energizing a liquid handling device, the method comprising: harvesting energy; storing the harvested energy in an energy storage in the liquid handling device, and energizing an electronic component of the liquid handling device with the stored and harvested energy.

Various embodiments of the second aspect may comprise at least one feature from the following bulleted list:

- Energy is harvested during pushing or releasing of a button of the liquid handling device by a magnet-through-coil system connected to the button.
- Energy is harvested during rotation of a button, for example a counter, of the liquid handling device.
- The liquid handling device is a hand-held pipette, and heat from a user's hand is harvested when the user holds the pipette by a thermoelectric generator integrated to the pipette.
- Ambient heat is harvested by a thermoelectric generator integrated to the liquid handling device.
- The liquid handling device is a hand-held pipette, and energy from mechanical movements or vibrations of the pipette or a part of the pipette is harvested by a piezoelectric material incorporated in a material of the pipette or in a material of the part of the liquid handling device, for example a button or a body or a handle of the liquid handling device.
- Solar energy is harvested by a solar cell integrated to the liquid handling device.
- The solar cell is a UV sensitive solar cell, and said harvesting is performed in a laminar hood illuminated by a UV light source.
- Energy derived from a user of the liquid handling device is harvested.
- Thermal energy derived from a user of the liquid handling device is harvested by a thermoelectric generator.

At least some embodiments of the present invention provide significant advantages in electronic pipettes. The charging interval can be increased from days to several months or even dispensed with completely.

At least some embodiments of the present invention provide advantages in mechanical pipettes. It becomes possible to include electronic functionalities in a mechanical pipette. Simultaneously the pipette can be light-weight, as there is no need to include a heavy battery. Further, the manner of using and controlling the pipette need not be altered. Many users prefer the feel and touch of a mechanical pipette over an electronic pipette.

At least some embodiments of the present invention make it possible to use a pipette for long periods of time in locations in which charging of a traditional battery is not possible.

EMBODIMENTS

Definitions

In the present context, the term "liquid handling device" comprises hand-held mechanical, electromechanical and electric pipettes, and automated liquid handling stations.

In the present context, the term "electromechanical pipette" comprises a mechanical pipette with electronic functionalities. Preferably, the pipette is an air displacement micropipette that uses disposable tips.

In the present invention, we have surprisingly observed that energy harvesting can be applied successfully in a liquid handling device, such as a pipette, to energize low-power electronic components. The principle of one form of energy harvesting, also known as power harvesting or energy scavenging, is that ambient energy is harvested and stored to energize electronic devices that have relatively low power requirements.

Energy harvesting systems can be based on, for example, photovoltaics, thermovoltaics, piezoelectrics or electrodynamics. These systems can take advantage of various forms of ambient or environmental energy, for example movements, light, and vibrations.

In some embodiments of the present invention, we have observed that the interaction of a user and a hand-held pipette provide unexpected and working possibilities for harvesting energy.

In a liquid handling device it is possible to harvest energy by various means. Preferably the means for harvesting energy is integrated to the liquid handling device, such as a pipette. In the following we describe different embodiments.

In one embodiment, a magnetic induction system is utilized in the form of a magnet-through-coil system to harvest kinetic energy. Power is generated through relative motion between a coil of wire and a magnet. The magnetic flux through the coil changes and a voltage differential across the ends of the wire coil is generated. The voltage difference can be used to charge a supercapacitor. In a pipette, a magnet can be arranged to move downwards through a coil when a mechanical control button or a mechanical tip ejection button of the pipette is pushed down. When the button is released, the magnet moves in an opposite direction through the coil.

Figure 1:
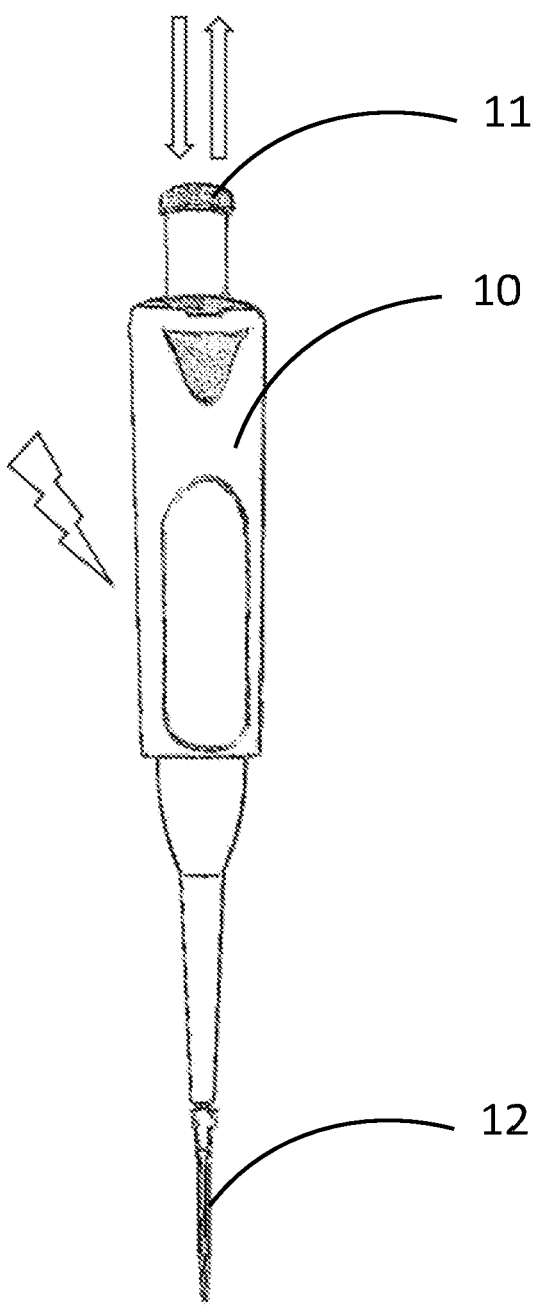
FIG. 1 illustrates an embodiment of the present invention in which energy is harvested from pushing and releasing movements of a button of a pipette.

FIG. 1 illustrates an embodiment of the present invention in which energy is harvested from pushing and releasing movements of a control button 11 of a mechanical pipette 10. The pipette 10 uses disposable tips 12.

Figure 2:
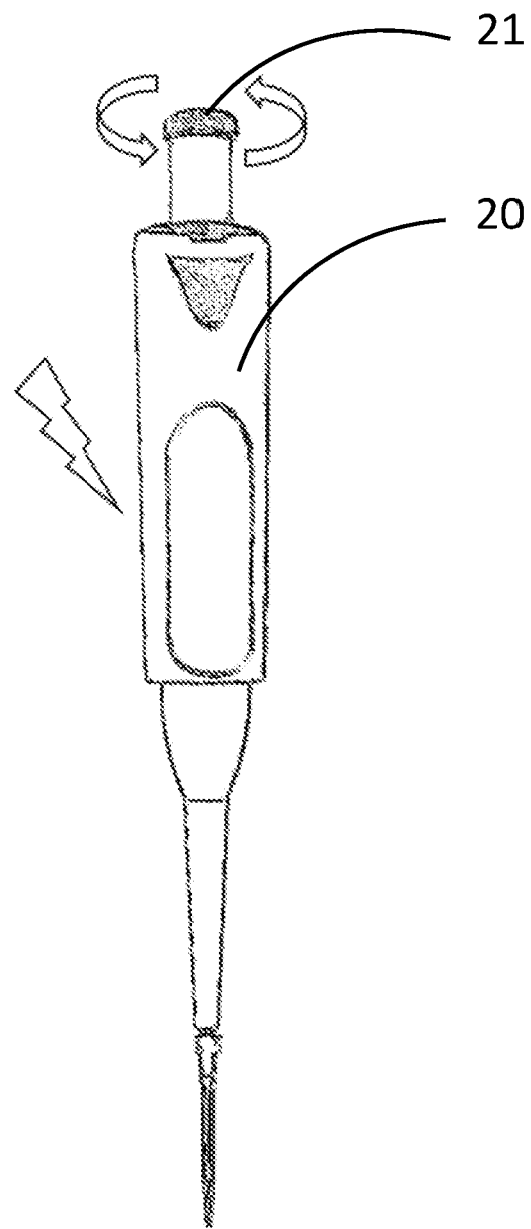
FIG. 2 illustrates an embodiment of the present invention in which energy is harvested from rotation movements of a button of a pipette.

FIG. 2 illustrates an embodiment of the present invention in which energy is harvested from rotation movements of a button 21 of a pipette 20. The button 21 is rotated in order to increase or decrease a counter.

In one embodiment, solar energy is harvested by means of a solar cell. The advantage is that continuous harvesting is possible as long as light is available. Here, the supply of energy is not limited to situations where the pipette is being used, moved or held in hand.

Solar energy harvesting is particularly advantageous in an electronic pipette. For example, by using a solar cell sensitive to UV light, an electronic pipette can be charged by an UV light source of a laminar hood. The pipette can be stored and used in a laminar hood for long periods of time without charging it on a traditional charging stand.

Figure 3:
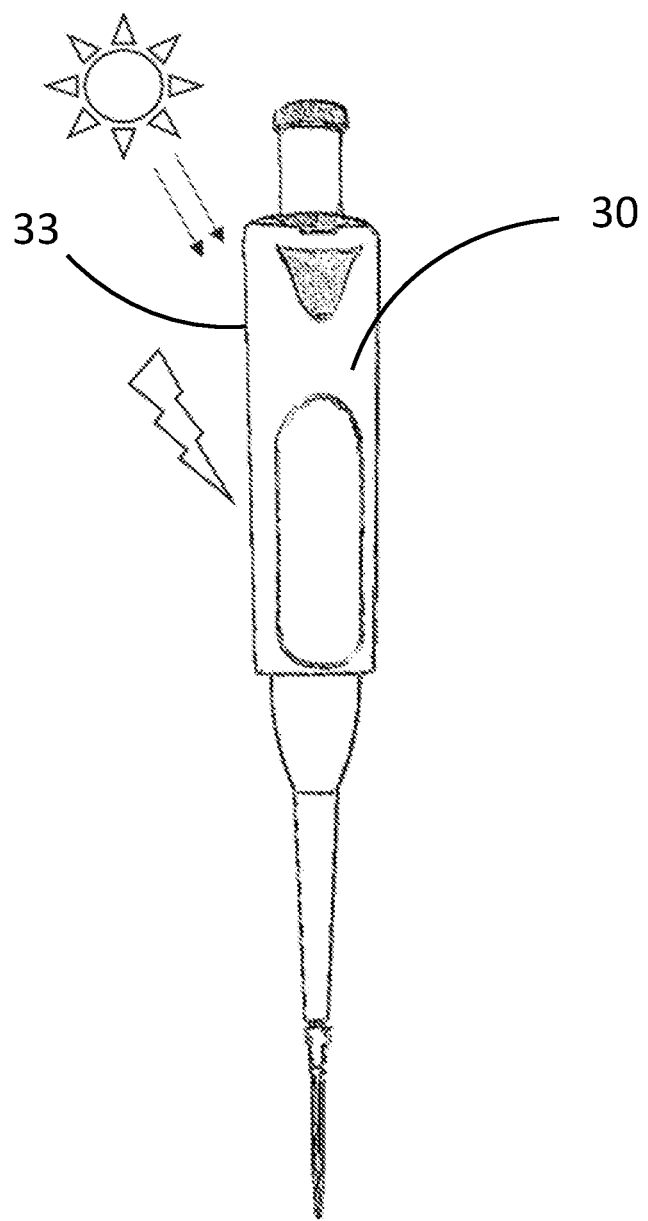
FIG. 3 illustrates an embodiment of the present invention in which solar energy is harvested.

FIG. 3 illustrates an embodiment of the present invention in which solar energy is harvested to a hand-held pipette 30 by a solar cell 33 located on the surface of the pipette body.

In an advantageous embodiment, a pipette contains a thermoelectric generator (a TEG or a Seebeck generator) that is arranged to harvest body heat for example from a user's hand when the user holds the pipette. A TEG is a solid state device that converts heat (temperature differences) directly into electrical energy through a phenomenon called the Seebeck effect. The advantage is that continuous harvesting is possible when the user holds the pipette, and the user is not required to push any buttons to activate or energize the pipette or its display in the beginning of a pipetting task. A TEG can be realized in the form of a Peltier module.

In one embodiment, a pipette contains a thermoelectric generator that is arranged to harvest ambient heat, e.g. heat derived from the temperature difference between the pipette and the surrounding air or any surrounding or near-by located surface.

In order to harvest ambient heat, the surface of the liquid handling device is preferably made of a dark and rough (e.g. texturized) material to produce a difference in reflectivity. For example, the surface of the pipette can be smoother and shinier than the top surface of a laboratory bench.

A temperature difference of 0.5° C. is sufficient in the embodiment utilizing a thermoelectric generator.

We have observed that body heat can provide enough harvested energy in a few seconds in order to energize electronic pipette components. The temperature difference can be maintained for several minutes.

In one embodiment, the liquid handling device comprises both a thermoelectric generator and a solar cell for harvesting energy. This embodiment ensures sufficient and continuous energy harvesting and power generation.

Figure 4:
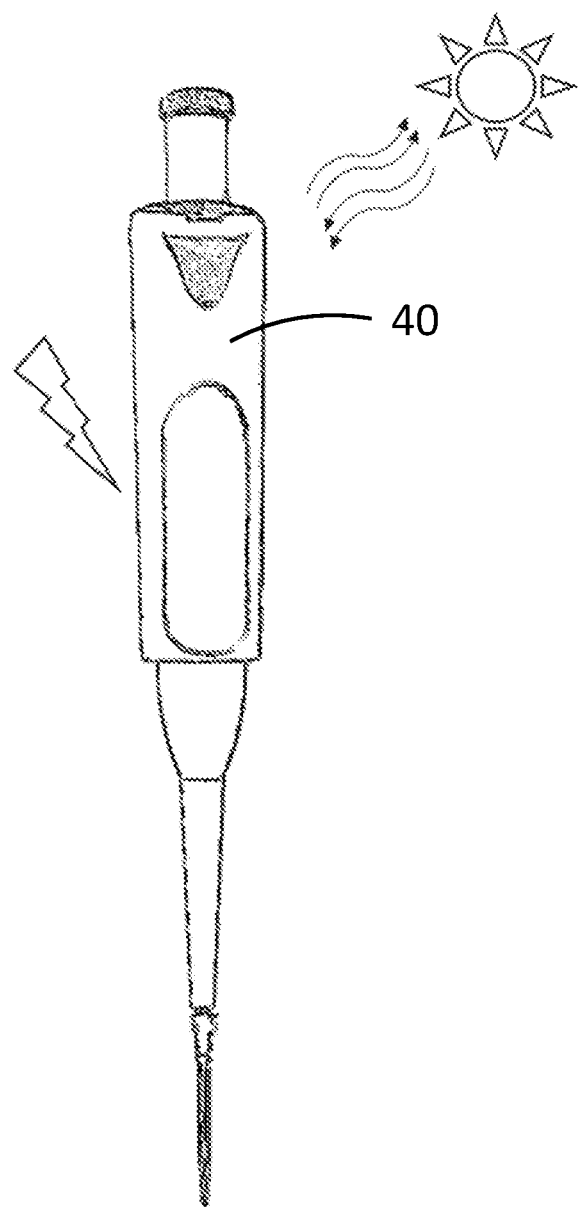
FIG. 4 illustrates an embodiment of the present invention in which ambient heat is harvested.

FIG. 4 illustrates an embodiment of the present invention in which ambient heat is harvested to a hand-held pipette 40 by a thermoelectric generator.

In one embodiment, piezoelectric materials are utilized. When a piezoelectric material is subjected to mechanical movement, deformation or vibration, a voltage differential is built up across the ends of the material. In a pipette, a layer of piezoelectric material can be arranged to any suitable location, for example in any of the buttons or a body or a handle or a finger hook or a tip cone of the pipette. Power can be generated when the user pushes the button and thus deforms the piezoelectric material. Alternatively, power can be generated when the user rotates a counter or moves the entire pipette. A piezoelectric material can be configured to harvest energy derived from any movement, turning, rotation, grasping, pressing or deformation of a part of the pipette or the entire pipette by a user.

Even very small movements in the millimetre scale, such as a single button pushing action or a slight rotation of a counter, are sufficient to energize electronic components in a hand-held pipette.

Another possible alternative is to use a system based on parallel-plate capacitors with movable plates. The plates are charged to a certain voltage. When the plates are mechanically moved due to mechanical vibrations, the distance between the plates increases, which results in energy being stored to the capacitor. The energy is harvested when the plates return to their original position.

The harvested energy is preferably stored in an energy buffer or energy storage that is integrated to the liquid handling device. The energy storage can be for example a lithium ion battery or a supercapacitor. A supercapacitor is advantageous, as it has a better efficiency than a Li ion battery. It can accept and deliver charge much faster than batteries, and tolerate many more charge and discharge cycles.

The harvested and stored energy can be used for energizing various low power electronic components in a liquid handling device, such as a hand-held pipette. Preferably, such an electronic component is integrated to the liquid handling device.

In a preferred embodiment, the energy is used for energizing an electronic paper display, e.g. a low power E ink display. An E ink display is able to show static information to the user even in the absence of any power supply. When harvested energy is available, the display can be updated and new information displayed. Use of an E ink display instead of an LCD display is advantageous, because it is easy to produce a curved E ink display that conforms to the shape of the pipette handle.

For example, the radius of curvature of the E ink display may be approximately the same as that of the handle or the body of the pipette. Preferably, the radius of curvature of the E ink display differs from the radius of curvature of the handle or the body of the pipette by 10% at maximum. More preferably, the E ink display is integrated to a body of the pipette and has a shape with substantially the same curvature as the body of the pipette.

An E ink display can be integrated to the body of the pipette seamlessly. Further, E ink displays can be produced as paper-thin components so that the space requirement is minimal in comparison to an LCD display or a mechanical volume counter.

A mechanical counter typically forms a significant portion of a mechanical pipette when considering the number of components and the amount of working hours. These components can be replaced with a single circuit board that provides an E ink display, a graphics card, position data and energy harvesting. Automated assembling of the pipette becomes possible as the number of small components is decreased. Also pad printing steps of the counter and the related costs are avoided.

In one embodiment, the energy is used for energizing components for wireless communication, such as an active or passive RFID tag attached to the liquid handling device. Other possible low power wireless techniques that can be energized by means of the present method are Bluetooth low energy, ANT, ZigBee, and RF4CE.

In one embodiment, the energy is used for energizing a sensor in a hand-held pipette.

Another example is an optical sensor or a photometric sensor configured to determine a liquid level or liquid volume inside a tip of a pipette. An optical sensor can be used for monitoring various changes in a state of the tip or its contents, such as contact of the tip with external surfaces or with liquid, or orientation (straightness) of the tip.

In an electronic pipette, multiple power sources can be utilized in parallel. For example, it is possible to supply power both from charging pins and from an energy storage containing harvested energy.

Some embodiments of the present invention are applicable even in automated liquid handling stations. Harvested energy, for example solar energy, can be used as a supplementary power source in liquid handling stations.

EXAMPLES

Example 1

In this example we describe an electromechanical pipette comprising an E ink touch display which is powered by harvesting kinetic energy.

Kinetic energy can be harvested for example during the following actions: tip picking (linear movement and pressure); counter movement (rotation); tip ejection (linear movement derived from a tip ejection button or a tip ejection sleeve); dispensing (linear movement); blow-out of remaining liquid sample after dispensing (linear movement, pressure).

Initially, the battery of the pipette is empty and the display shows, for example, the text "Push eject to start" or "Push eject to unlock". The user is not explicitly prompted to charge the battery, and he does not even need to be aware of the charging requirements of the pipette. To use the pipette, no cords or chargers are needed. The charging movements form the starting routine in order to begin dispensing.

Charging of the pipette is carried out by performing a few, for example 1 to 5, charging movements, which can be any of the above listed. When the battery or capacitor that functions as an energy buffer has reached the required energy level, the pipette analyses the dispensing volume, and the display becomes activated and shows the volume and possibly graphic symbols.

Energy that is harvested during normal pipetting tasks is sufficient to charge the battery and to maintain the functionalities of the low-power electronics. When the charge of the battery approaches the threshold of the trigger current, the display automatically goes to a static state and shows the text "Push eject to start". The text would stay visible even though the battery would become discharged, as the E ink display does not need any power to show static, non-updated information.

The power requirements of the E ink display are very low, because the battery charge is only used for updating the display and for analysing the position of the plunger. Detection of plunger location is carried out electronically, for example by means of a position sensor, or by means of a resistor whose resistance varies as a function of the plunger's position. The latter alternative would enable a simple calibration or resetting of the counter to be carried out.

From a user's point of view, dispensing, volume adjustment, and tip ejection actions take place in the same way as in a mechanical pipette.

To calibrate the pipette, the user selects the volume for which calibration is to be performed, for example 1000 μl. Then the user presses "cal" on the display. The push button is rotated until the display shows the average of actual volume dispensed with this volume setting, for example 980 μl. The user presses "cal" again, after which the display shows 1000 μl.

Example 2

In one embodiment, harvested energy can be utilized in a mechanical pipette for incrementing an electronic usage counter that counts pushing actions of a control button and in this way records the usage (e.g. the number of dispensing events) of the pipette. After a certain threshold has been exceeded, the pipette indicates to the user that the pipette should be calibrated or serviced. Alternatively, the user may follow the counter value actively by himself and make a decision on the appropriate time for carrying out calibration and/or servicing. Preferably, the means for harvesting energy is a magnet moving back and forth inside a coil as a response to pushing and releasing of the control button or a tip ejection button.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to one embodiment or an embodiment means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. Where reference is made to a numerical value using a term such as, for example, about or substantially, the exact numerical value is also disclosed.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In this description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", that is, a singular form, throughout this document does not exclude a plurality.

INDUSTRIAL APPLICABILITY

At least some embodiments of the present invention find industrial application in electronic or electromechanical hand-held pipettes.

ACRONYMS LIST

LCD Liquid Crystal Display
TEG Thermoelectric Generator
RFID Radio-frequency identification

REFERENCE SIGNS LIST

| | |
|---|---|
| 10, 20, 30, 40 | pipette |
| 11, 21 | control button |
| 12 | disposable tip |
| 33 | solar cell |

CITATION LIST

Patent Literature

WO 2014138530 A2

The invention claimed is:

1. A liquid handling device comprising:
   means for harvesting energy;
   energy storage arranged for storing the harvested energy in the liquid handling device; and
   an electronic component connected to the energy storage and configured to use the energy storage as a power source,
   wherein the liquid handling device is a hand-held pipette, and
   wherein the means for harvesting energy comprises:
   (i) a magnet-through-coil system connected to a button of the liquid handling device, wherein the magnet-through-coil system is configured to harvest energy when the button is pushed or released,
   or
   (ii) a thermoelectric generator,
   or
   (iii) a piezoelectric material, wherein the piezoelectric material is incorporated in a material of a part of the pipette.

2. The liquid handling device according to claim 1, wherein the liquid handling device is a hand-held pipette, and wherein the means for harvesting energy comprises a solar cell integrated to the pipette.

3. The liquid handling device according to claim 1, wherein the liquid handling device is a hand-held pipette, and wherein the electronic component is an electronic paper display integrated to a body of the pipette and having a shape with substantially the same curvature as the body of the pipette.

4. The liquid handling device according to claim 1, wherein the electronic component is a sensor configured to measure a state of the liquid handling device.

5. The liquid handling device according to claim 4, wherein the sensor is an optical sensor configured to monitor a tip of the liquid handling device or the contents of the tip.

6. The liquid handling device according to claim 1, wherein the electronic component is an RFID tag attached to the liquid handling device.

7. The liquid handling device according to claim 1, wherein the electronic component is a usage counter that records the usage of the liquid handling device.

8. The liquid handling device according to claim 1, wherein the energy storage is a lithium ion battery or a supercapacitor.

9. A method for energizing a liquid handling device comprising:
   harvesting energy;
   storing the harvested energy in an energy storage in the liquid handling device, and
   energizing an electronic component of the liquid handling device with the stored and harvested energy
   wherein the liquid handling device is a hand-held pipette, and
   wherein in said harvesting step:
   (i) energy is harvested during pushing or releasing of a button of the hand-held pipette by a magnet-through-coil system connected to the button, or
   (ii) energy is harvested by a thermoelectric generator wherein the hand-held pipette comprises the thermoelectric generator, or
   (iii) energy is harvested by a piezoelectric material incorporated in a material of a part of the hand-held pipette.

10. The method according to claim 9, wherein energy is harvested during pushing or releasing of a button of the liquid handling device by a magnet-through-coil system connected to the button.

11. The method according to claim 9, wherein energy is harvested during rotation of a button, for example a counter, of the liquid handling device.

12. The method according to claim 9, wherein the liquid handling device is a hand-held pipette, and wherein heat from a user's hand is harvested when the user holds the pipette by a thermoelectric generator integrated to the pipette.

13. The method according to claim 9, wherein ambient heat is harvested by a thermoelectric generator integrated to the liquid handling device.

14. The method according to claim 9, wherein the liquid handling device is a hand-held pipette, and wherein energy from mechanical movements or vibrations of the pipette or a part of the pipette is harvested by a piezoelectric material incorporated in a material of the pipette or in a material of the part of the liquid handling device, for example a button or a body or a handle of the liquid handling device.

15. The method according to claim 9, wherein solar energy is harvested by a solar cell integrated to the liquid handling device.

16. The method according to claim 9, wherein thermal energy derived from a user of the liquid handling device is harvested by a thermoelectric generator.

17. The method according to claim 9, wherein:
   the liquid handling device is a hand-held pipette,
   energy from mechanical movements or vibrations of the pipette or a part of the pipette is harvested by a piezoelectric material incorporated in one or more of the following: a button, a counter, a finger hook, a tip cone, a body and a handle of the pipette,
   the electronic component is an electronic paper display integrated to the body of the pipette, and
   the radius of curvature of the electronic paper display differs from the radius of curvature of the body of the pipette by 10% at maximum.

* * * * *